United States Patent
Ooi et al.

(10) Patent No.: US 6,969,973 B2
(45) Date of Patent: Nov. 29, 2005

(54) APPARATUS FOR CALCULATING REMAINING BATTERY CAPACITY

(75) Inventors: Kozo Ooi, Sumoto (JP); Masao Yamaguchi, Sumoto (JP)

(73) Assignee: Sanyo Electric Co., Ltd., Osaka (JP)

(*) Notice: Subject to any disclaimer, the term of this patent is extended or adjusted under 35 U.S.C. 154(b) by 198 days.

(21) Appl. No.: 10/700,673

(22) Filed: Nov. 5, 2003

(65) Prior Publication Data

US 2004/0090207 A1    May 13, 2004

(30) Foreign Application Priority Data

Nov. 8, 2002 (JP) ............................. 2002-325070
Aug. 20, 2003 (JP) ............................. 2003-296927

(51) Int. Cl.[7] .............................................. H02J 7/00
(52) U.S. Cl. ................................................... 320/132
(58) Field of Search ................................ 320/132, 127; 702/63; 324/427, 431, 435

(56) References Cited

U.S. PATENT DOCUMENTS

| | | | | |
|---|---|---|---|---|
| 4,678,998 A | * | 7/1987 | Muramatsu | 324/427 |
| 5,126,675 A | * | 6/1992 | Yang | 324/435 |
| 5,404,106 A | * | 4/1995 | Matsuda | 324/431 |
| 5,631,540 A | * | 5/1997 | Nguyen | 320/127 |
| 6,061,639 A | * | 5/2000 | Wistrand | 702/63 |
| 6,107,779 A | * | 8/2000 | Hara et al. | 320/132 |

FOREIGN PATENT DOCUMENTS

JP    10-274670    10/1998

* cited by examiner

Primary Examiner—Pia Tibbits
(74) Attorney, Agent, or Firm—Wenderoth, Lind & Ponack, L.L.P.

(57) ABSTRACT

An apparatus for calculating remaining capacity of a battery is provided with a current detection section to detect current flow in the battery, a remaining capacity calculation section to integrate the current value detected by the current detection section and calculate remaining capacity, and a memory section to store discharge current within a specified current range. When current detected by the current detection section is within a specified range, the remaining capacity calculation section uses current values stored in the memory section, rather than values detected by the current detection section, as discharge current to calculate remaining capacity.

17 Claims, 2 Drawing Sheets

APPARATUS FOR CALCULATING REMAINING BATTERY CAPACITY

This application is based on Applications No. 325070 filed in Japan on Nov. 8, 2002 and No. 296927 filed in Japan on Aug. 20, 2003, the contents of which are incorporated hereinto by reference.

BACKGROUND OF THE INVENTION

This invention relates to an apparatus to calculate remaining capacity, which detects battery current and calculates remaining battery capacity.

Remaining battery capacity can be calculated by subtracting discharge capacity from charge capacity. Charge capacity is calculated by integrating charging current, and discharge capacity is calculated by integrating discharge current. Consequently, battery charging current and discharge current are detected in order to calculate remaining battery capacity. A prior art apparatus calculates remaining capacity by detecting battery current via a current detection section, and calculating remaining capacity by integrating the detected current values.

Patent Reference [1]: Japanese Non-Examined Patent Publication No. 274670/1998

In prior art apparatus, which calculates remaining capacity by integrating current detected by a current detection section, current detection section errors cause remaining capacity values to go astray. These errors accumulate over time and become large. When battery capacity cannot be accurately calculated in a system which controls charging and discharging based on remaining capacity, remaining capacity errors are a cause of battery over-charging, battery over-discharge, and battery degradation. This drawback can be prevented by accurate current detection. However, if current is detected with high precision, the cost of components becomes extremely high. For example, a remaining capacity computation section, which calculates remaining capacity by operating on a digital signal, converts an analog signal from the current detection section to a digital signal via an analog to digital (A/D) converter. However, noise is generated by digitizing, or converting an analog signal to discrete digital values, causing degradation of current measurement resolution. For example, the resolution of an 8-bit A/D converter is 1/256. Using an 8-bit A/D converter with a maximum detected current of 2.56A, corresponds to a resolution of 10 mA for each bit of the A/D converter. Measured current for the A/D converter is at 10 mA intervals, or 10 mA, 20 mA, 30 mA, 40 mA, etc. Therefore, when actual discharge current is 16 mA, for example, the current detection section detects 20 mA of discharge current. Consequently, a large 25% error is generated. This error accumulates leading the remaining capacity astray while degrading the precision of remaining capacity calculations. Errors resulting from digitizing can be reduced by increasing the number of bits of the A/D converter. For example, using a 10-bit A/D converter can reduce digitizing noise by ¼ that of an 8-bit A/D converter. However, A/D converters have the drawback that the greater the number of bits, the higher the cost. Further, even if the output of the current detection section is digitized using a 10-bit or greater A/D converter, there is also some inherent measurement error in the current detection section itself, and that error is a cause of inaccuracies in remaining capacity calculation as well.

SUMMARY OF THE INVENTION

The present invention was developed to solve these types of drawbacks. Thus, it is a primary object of the present invention to provide an apparatus to calculate remaining capacity of a battery, which can accurately calculate remaining capacity without raising the cost of component parts.

The apparatus to calculate remaining capacity of a battery of the present invention is provided with a current detection section to detect current flowing in the battery, a remaining capacity calculation section to integrate current values detected by the current detection section and calculate remaining capacity, and a memory section to store discharge current over a specified current range. When the current detected by the current detection section is within the specified current range, the remaining capacity calculation section calculates discharge current and remaining capacity with a current value stored in the memory section not the current value detected by the current detection section.

The remaining capacity calculation section can be provided with an A/D converter to convert current detection section analog values to digital values. This type of remaining capacity calculation section converts current detection section signals to digital values via the A/D converter and calculates remaining capacity. The memory section can store a plurality of current values for a plurality of current ranges. When current value detected by the current detection section is in a specified range, the remaining capacity calculation section calculates remaining capacity with a current value stored in the memory section.

Further, the specified current ranges and stored current values are set by information from the connected equipment.

The apparatus to calculate remaining capacity of a battery described above is characterized by the ability to accurately calculate remaining capacity without increasing the cost of component parts. This is because current flow through the battery of the apparatus is not just detected by the current detection section, but is also stored in the memory section as current values for discharge current in a specified range. For the case of current value detected by the current detection section which is in a specified current range, the remaining capacity calculation section, which calculates remaining battery capacity, does not use current detected by the current detection section as discharge current, but rather uses a current value stored in the memory section to calculate remaining capacity. Consequently, even though there is measurement error in the current detection section and digitizing noise is generated when converting the current detection section analog signal to digital values, discharge current in a specified range can be accurately determined and remaining capacity can be calculated with high degree of precision. For a great deal of electrical equipment, power is discharged at a constant current under normal conditions. Since the time for discharge at constant current is longer than the time for discharge at high currents, accurate detection of current in the constant current range is particularly important. Since the present invention can accurately detect discharge current under these conditions, it has the characteristic that it can calculate remaining capacity with high precision. In particular, remaining capacity can be accurately calculated without increasing the number of bits of the A/D converter, which converts analog values to digital values, or by increasing the measurement precision of the current detection section. Therefore, the present invention has the exceptional characteristic that remaining capacity can be accurately calculated without error and without increasing the cost of component parts.

The specified current range and stored current values for calculating remaining capacity are not limited only to values stored ahead of time in the apparatus. By setting specified current range and current values, which are stored in memory, via information from connected electrical equipment, specified current range and current values can be made suitable for the operating conditions of the electrical equipment, mode of operation, or for different types of electrical equipment, and remaining capacity can be accurately calculated. In addition, by setting specified current range and current values via information from connected electrical equipment, the process of setting and storing those values in the apparatus to calculate remaining capacity ahead of time can be omitted.

The above and further objects and features of the invention will more fully be apparent from the following detailed description in conjunction with the accompanying drawings.

DETAILED DESCRIPTION OF THE INVENTION

Figure 1:
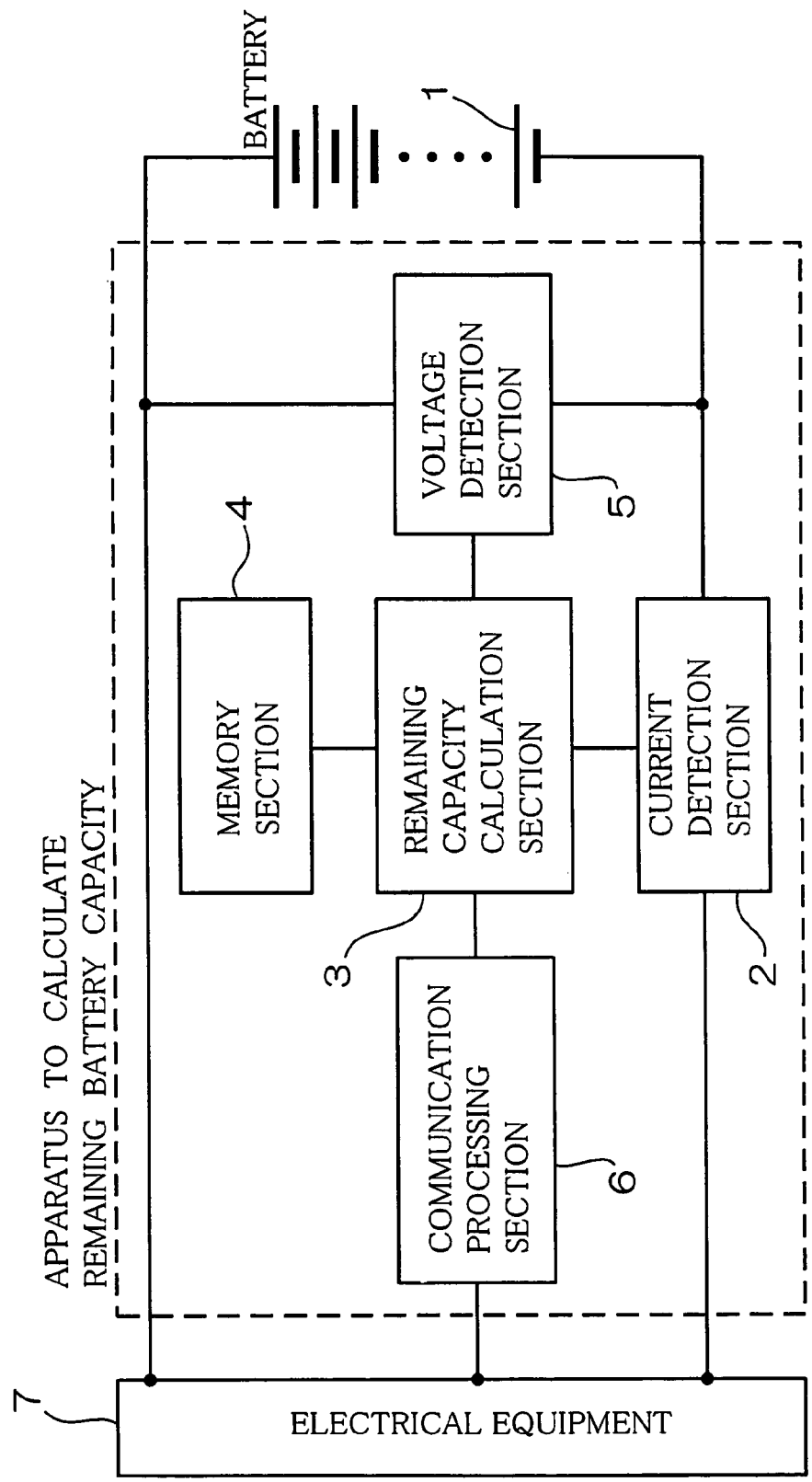
FIG. 1 is a block diagram of an apparatus to calculate remaining capacity of a battery as an embodiment of the present invention.

The apparatus to calculate remaining capacity of a battery shown in FIG. 1 is provided with a current detection section 2 to detect charging current and discharge current flowing in the battery 1, a remaining capacity calculation section 3 to integrate current values detected by the current detection section 2 and calculate remaining capacity of the battery 1, a memory section 4 to store discharge current in specified current ranges, a voltage detection section 5 to detect battery voltage, and a communication processing section 6 to relay remaining capacity of the battery 1 to attached electrical equipment.

Although not illustrated, the current detection section 2 is provided with a current detection resistor connected in series with the battery and an amplifier to increase the magnitude of the voltage developed across the terminals of the current detection resistor. The current detection section 2 outputs an analog voltage proportional to the current flowing in the battery 1. Since the direction of current flow in the battery 1 is different for charging current and discharge current, charging current can be distinguished from discharge current by the voltage output from the current detection section 2. Specifically, the amount of current is determined by the magnitude of the output voltage, and charging current is distinguished from discharge current by the sign of the output voltage. However, the current detection section of the apparatus to calculate remaining capacity of the present invention is not limited to the current detection section described above. Any configuration which can detect current flow in a battery can be used as the current detection section. For example, a current detection section which determines current by detecting magnetic flux, which is proportional to current, can also be used.

The remaining capacity calculation section 3 calculates remaining capacity by subtracting discharge capacity from charge capacity. Charge capacity is calculated from the integral of charging current, and discharge capacity is calculated from the integral of discharge current. In addition, charge capacity calculated from the integral of charging current is corrected for charging efficiency, and discharge capacity calculated from the integral of discharge current is corrected for discharge efficiency. This is because 100% of the charging current is not used to charge the battery 1, and the amount of usable capacity varies depending on the discharge current.

The remaining capacity calculation section 3 calculates remaining capacity with detected current values from the current detection section 2 and with stored current values from the memory section 4. Under conditions where the current value detected by the current detection section 2 is within a specified range, the remaining capacity calculation section 3 calculates discharge current and remaining capacity not with the value detected by the current detection section 2, but rather with a current value stored in the memory section 4.

The remaining capacity calculation section 3 is provided with an A/D converter (not illustrated) to convert the analog current signal output from the current detection section 2 to a digital value. The remaining capacity is calculated by operating on the current converted to a digital value by the A/D converter. The remaining capacity calculation section 3 does not calculate remaining capacity with only the current signal output from the current detection section 2. When the current value detected by the current detection section 2 is within a specified range, the remaining capacity calculation section 3 calculates discharge current and remaining capacity with a current value stored in the memory section 4 instead of with the value detected by the current detection section 2.

Figure 2:
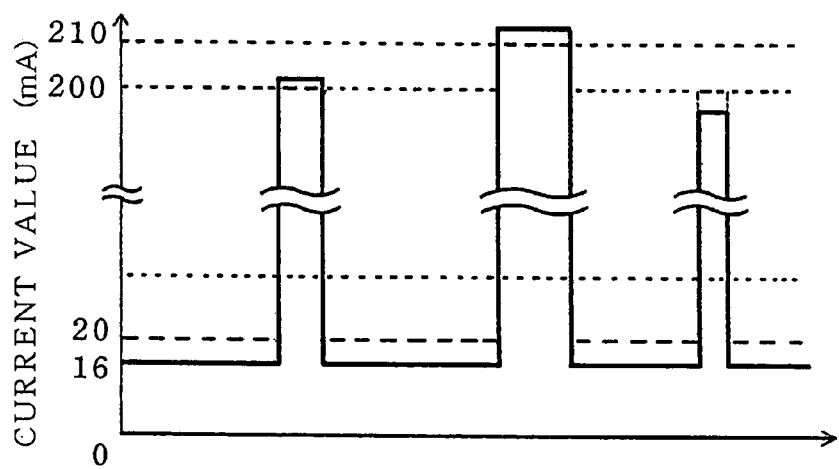
FIG. 2 is a graph showing an example of connected electrical equipment discharge behavior.

For example, suppose as shown in FIG. 2, discharge is normally at 16 mA of current, but occasionally discharge occurs with a current pulse on the order of 200 mA. In this type of discharge, when the current value detected by the current detection section 2 is less than 30 mA, the remaining capacity calculation section 3 does not use the current detected by the current detection section 2, but rather uses the current value of 16 mA which is stored in the memory section 4 as discharge current to calculate remaining capacity. Because current resolution is low, the current value detected by the current detection section 2 is 20 mA, while the 16 mA current value from memory is close to the actual current.

Figure 3:
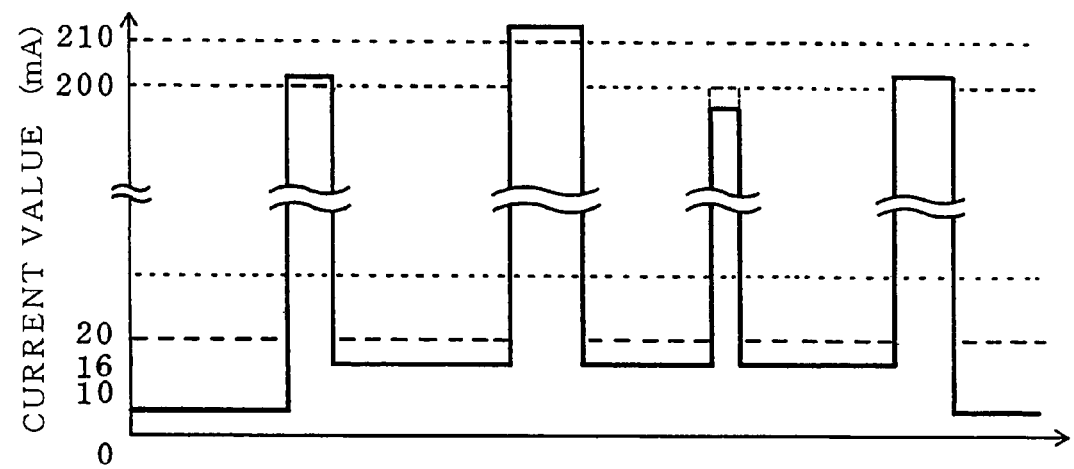
FIG. 3 is a graph showing another example of connected electrical equipment discharge behavior.

Further, as shown in FIG. 3, there is electrical equipment 7 which normally discharges at extremely small current, but during use discharges at low current and at high current pulses. For example, a portable (wireless) telephone discharges at extremely small current when on standby, discharges at low current when receiving a call, and discharges at high current when transmitting. In this type of electrical equipment 7 discharge, when the current value detected by the current detection section 2 is less than 10 mA, the remaining capacity calculation section 3 calculates remaining capacity with a discharge current of 5 mA, which is the first current value stored in the memory section 4. When the current value detected by the current detection section 2 is in a range between 10 mA and 30 mA, the remaining capacity calculation section 3 calculates remaining capacity with a discharge current of 16 mA, which is the second current value stored in the memory section 4.

As described above, the current value for the remaining capacity calculation section 3 to calculate remaining capacity and the current range for that calculation is stored in the memory section 4. As shown in FIG. 2, one current range is stored in memory, and when the current detected by the current detection section 2 is within that range, the remaining capacity calculation section 3 uses an accurate current value stored in the memory section 4 as the battery 1 discharge current in that range. As shown in FIG. 3, two current ranges can also be stored in memory, and when the current detected by the current detection section 2 is within either range, the remaining capacity calculation section 3 uses an accurate current value stored in the memory section 4 as the battery 1 discharge current in that range. Further, although not illustrated, there may also be three or more current ranges, and the remaining capacity calculation section 3 can select appropriate current values stored in the memory section 4 for remaining capacity calculation rather than using current detected by the current detection section 2.

Discharge characteristics as shown in FIGS. 2 and 3, where discharge is at a very low constant current with occasional very high current discharges, is not only typical of electrical equipment which contain transmitters and receivers, such as portable telephones, but is also characteristic of various portable electrical equipment. In particular, for electrical equipment configured as a plurality of blocks, where each block has an active and inactive state, well-defined currents are established depending on which blocks are active. There are blocks, which comprise electrical equipment, that discharge at constant currents. When a component block or plurality of blocks, which discharge at a constant current, are active, discharge current of the electrical equipment is constant. For example, in the case of electrical equipment such as a video camera or digital still camera, high current discharge occurs when the shutter switch is pressed, but when the power switch is on and the shutter switch is not pressed, discharge is at a low constant current. Further, in these types of electrical equipment, discharge is at extremely small current when the display screen is off and is at high current when the display screen is on. When the shutter switch is pressed, discharge is at very high current to perform various digital processing, etc. In laptop computers as well, discharge is at extremely small current in standby mode, but very high current discharge occurs during key operation for various digital processing or during hard disk and CD ROM activation. In these various types of electrical equipment, circuits and mechanisms switch on or off as a block which is activated depending on operating conditions, thereby changing the discharge current. In the apparatus to calculate remaining capacity of the present invention, the current detection section 2 does not precisely detect current under all conditions. When discharge is at a constant current in a specified current range, remaining capacity is calculated with precision which is greater than that of the current detection section 2 or the A/D converter by using a current value stored in the memory section 4 as the discharge current.

The memory section 4 stores current values which are discharge currents in a load within specified current ranges. Stored current in memory may be a single value or a plurality of values. The load, which is electrical equipment 7 supplied by power from the battery 1, discharges at a constant current within specified current ranges. In other words, the memory section 4 stores discharge currents for specified current ranges where the electrical equipment 7 discharges at constant current. Consequently, the memory section 4 of an apparatus to calculate remaining capacity of a battery 1 attached to electrical equipment 7 with a plurality of current ranges for constant current discharge, stores current values corresponding to discharge currents for a plurality of current ranges. The memory section 4 is solid state memory. However, in addition to solid state memory, the memory section 4 can also be any memory material which can store current values, such as a hard disk, etc. In particular, in an apparatus to calculate remaining capacity with a communication processing section 6, as shown in FIG. 1, a memory section can be provided in the electrical equipment 7 connected to the battery 1, and current values can be stored in that memory section. Consequently, the apparatus to calculate remaining capacity of the present invention does not necessarily have to house a memory section 4 in the battery 1 (battery pack) as shown in FIG. 1, and the memory section may also be provided external to the battery 1.

The voltage detection section 5 detects battery voltage and revises remaining capacity calculated by the remaining capacity calculation section 3. This is because battery voltage becomes a prescribed voltage at complete discharge and at full charge. In particular, since lithium ion rechargeable battery complete discharge and full charge can be determined by battery voltage, battery complete discharge and full charge can be detected and remaining capacity revised. Since battery voltage of a nickel hydrogen battery or nickel cadmium battery reaches a peak voltage or voltage drops by a $\Delta V$ from the peak voltage at full charge, that characteristic can be detected to determine full charge. In addition, minimum voltage can be detected to determine complete discharge.

The communication processing section 6 sends the remaining capacity calculated by the remaining capacity calculation section 3 to the connected electrical equipment 7. The communication processing section 6 sends remaining battery capacity to the connected electrical equipment 7 at set time intervals, or it outputs remaining capacity when a remaining capacity request signal is input from the electrical equipment 7. Electrical equipment 7, which receives the remaining capacity information, uses remaining capacity as a parameter to controls battery charging and discharge to avoid battery over-charge and over-discharge. For example, electrical equipment may switch power off to avoid battery over-discharge, or it may display instructions to switch power off. In addition, electrical equipment may suspend charging to avoid battery over-charge.

As described above, when the current value detected by the current detection section 2 is in a specified range, the remaining capacity calculation section 3 calculates remaining capacity with discharge current determined by a current value stored in the memory section 4 rather than by the value detected by the current detection section 2. Finally, with additional functions added to the communication processing section 6, remaining capacity calculation section 3, and memory section 4, prescribed current ranges and current values suitable for electrical equipment 7 operating conditions, electrical equipment 7 operating mode, and for different types of electrical equipment 7 can be set based on information received from the connected electrical equipment 7.

For example, a single portable telephone, which is the electrical equipment 7, may have a mode of operation which adopts the specified current range and current value described for FIG. 2, and may also have a mode of operation which adopts the specified current ranges and current values described for FIG. 3. In that case, information sent from the electrical equipment 7, via the communication processing section 6 of the apparatus to calculate remaining capacity of the present embodiment, sets the specified range and current values corresponding to the conditions of each operating mode.

In addition, different types of electrical equipment 7 may be connected with the apparatus to calculate remaining capacity of the present embodiment. For example, one type of electrical equipment 7 may adopt the specified current range and current value described for FIG. 2, while another type of electrical equipment 7 may adopt the specified current ranges and current values described for FIG. 3. In that case, information sent from the connected electrical equipment 7, via the communication processing section 6 of the apparatus to calculate remaining capacity of the present embodiment, sets the specified range and current values corresponding to each type of electrical equipment 7.

In the manner described above, the apparatus to calculate remaining capacity is not limited to only storing specified current range and current values ahead of time. Specified current range and current values appropriate for electrical equipment 7 operating conditions, electrical equipment 7 operating mode, and different types of electrical equipment 7 can be set by information from the connected electrical equipment 7, and remaining capacity can be accurately calculated. Further, by setting specified current range and current values with information from the connected electrical equipment 7, the process of setting those values in the apparatus to calculate remaining capacity ahead of time, can be omitted.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims or equivalence of such meets and bounds thereof are therefore intended to be embraced by the claims.

What is claimed is:

1. An apparatus for calculating remaining capacity of a battery, the apparatus comprising a current detection section for detecting current flow in the battery, a remaining capacity calculation section for integrating the current value detected by the current detection section and calculating remaining capacity, and a memory section for storing discharge current within a specified current range;
    wherein in the case of current value detected by the current detection section in a specified current range, the remaining capacity calculation section calculates remaining capacity and discharge current using a current value stored in the memory section rather than the value detected by the current detection section.

2. An apparatus for calculating remaining capacity of a battery as recited in claim 1, wherein the remaining capacity calculation section is provided with an A/D converter for converting current detection section analog values to digital values, and the remaining capacity calculation section is operable to convert current detection section analog signals to digital values via the A/D converter and to calculate remaining capacity.

3. An apparatus for calculating remaining capacity of a battery as recited in claim 1, wherein the memory section is operable to store a plurality of current ranges and a plurality of current values, and in the case of the value detected by the current detection section in a specified current range, the remaining capacity calculation section calculates remaining capacity with a current value stored in the memory section.

4. An apparatus for calculating remaining capacity of a battery as recited in claim 1, wherein the specified current range and stored current value are set by information from the connected electrical equipment.

5. An apparatus for calculating remaining capacity of a battery as recited in claim 4, wherein the stored current value is specified according to operating conditions of the electrical equipment to which the battery is connected.

6. An apparatus for calculating remaining capacity of a battery as recited in claim 4, wherein the stored current value is specified according to operating mode of the electrical equipment to which the battery is connected.

7. An apparatus for calculating remaining capacity of a battery as recited in claim 4, wherein the stored current value is specified according to type of electrical equipment to which the battery is connected.

8. An apparatus for calculating remaining capacity of a battery as recited in claim 1, wherein the electrical equipment to which the battery is connected is either a portable telephone, video camera, digital still camera, or laptop computer.

9. An apparatus for calculating remaining capacity of a battery as recited in claim 1, wherein the electrical equipment to which the battery is connected is equipment which discharges via current pulses.

10. An apparatus for calculating remaining capacity of a battery as recited in claim 1, wherein the electrical equipment to which the battery is connected is provided with a plurality of component blocks, and discharge current is specified by the blocks that are activated.

11. An apparatus for calculating remaining capacity of a battery as recited in claim 1, wherein the battery is housed in a battery pack and the battery pack is provided with a memory section for storing current values.

12. An apparatus for calculating remaining capacity of a battery as recited in claim 1, wherein the electrical equipment to which the battery is attached is provided with a memory section for storing current values.

13. An apparatus for calculating remaining capacity of a battery as recited in claim 1, wherein a voltage detection circuit is provided to revise remaining battery capacity, battery voltage is detected by this voltage detection circuit, and remaining capacity calculated by the remaining capacity calculation section is revised.

14. An apparatus for calculating remaining capacity of a battery as recited in claim 1, wherein a communication processing section is provided to send remaining capacity values to electrical equipment to which the battery is attached, and remaining capacity calculated by the remaining capacity calculation section is sent to the electrical equipment by the communication processing section.

15. An apparatus for calculating remaining capacity of a battery as recited in claim 14, wherein the communication processing section is operable to send remaining capacity values to the connected electrical equipment at fixed time intervals.

16. An apparatus for calculating remaining capacity of a battery as recited in claim 14, wherein the communication processing section is operable to send remaining capacity values when a remaining capacity request signal is input from the connected electrical equipment.

17. An apparatus for calculating remaining capacity of a battery as recited in claim 14, wherein the communication processing section is provided with a memory section.

* * * * *